United States Patent [19]

Kaufmann

[11] Patent Number: 5,525,420
[45] Date of Patent: Jun. 11, 1996

[54] METHOD FOR INCREASING THE SERVICE LIFE OF TOOLS AND A WEAR PROTECTION-COATED TOOL

[75] Inventor: Helmut Kaufmann, Triesen, Liechtenstein

[73] Assignee: Balzers Aktiengesellschaft, Furstentum, Liechtenstein

[21] Appl. No.: 212,271

[22] Filed: Mar. 14, 1994

[30] Foreign Application Priority Data

Mar. 16, 1993 [CH] Switzerland ............................... 790/93

[51] Int. Cl.⁶ .................................................. C23C 28/00
[52] U.S. Cl. ......................... 428/336; 51/295; 51/307; 51/309; 428/469; 428/472; 428/698; 428/701; 428/702
[58] Field of Search ......................... 428/698, 336, 428/701, 702, 472, 469; 51/295, 307, 309

[56] References Cited

U.S. PATENT DOCUMENTS

| | | | |
|---|---|---|---|
| 3,189,477 | 6/1965 | Shaffer | 428/698 |
| 3,964,937 | 6/1976 | Post et al. | 428/698 |
| 4,197,175 | 4/1980 | Moll et al. | 204/192 R |
| 4,556,607 | 12/1985 | Sastri | 428/621 |
| 4,877,505 | 10/1989 | Bergmann | 204/192.38 |
| 5,229,570 | 7/1993 | Kaufmann | 219/121.28 |
| 5,250,779 | 10/1993 | Kaufmann et al. | 219/121.12 |

FOREIGN PATENT DOCUMENTS

| | | |
|---|---|---|
| 0470359 | 2/1991 | European Pat. Off. |
| 2110202 | 6/1972 | France . |
| 2110246 | 6/1981 | United Kingdom . |
| 2226334 | 6/1989 | United Kingdom . |

OTHER PUBLICATIONS

Search Report May 27, 1994 in EP 94 103656.
CH 0790/93 Search Report.
Chem Abst. vol. 93, No. 12 (1980) Ab. No. 118218a.

*Primary Examiner*—A. A. Turner
*Attorney, Agent, or Firm*—Notaro & Michalos

[57] ABSTRACT

A method of increasing the service life of a tool and a tool coated according to the method comprises a wear resist of MeX, where Me is a metal including at least 50% group IVb metal, and X is either carbon, oxygen, nitrogen or boron with at least 50% oxygen. An intermediate layer between the substrate of the tool and the wear resistent layer is made of CrX and has a thickness of 5 nm$\leq$d$\leq$1000 nm, where d is the thickness.

7 Claims, 4 Drawing Sheets

METHOD FOR INCREASING THE SERVICE LIFE OF TOOLS AND A WEAR PROTECTION-COATED TOOL

FIELD AND BACKGROUND OF THE INVENTION

The present invention relates in general to methods and coatings for increasing the service life of tools, and in particular to a new and useful method of increasing the service life of a machining or forming tool by including an intermediate layer having the formula CrX, between the tool material or substrate and a coating on top of the substrate made of MeX, where X is carbon, oxygen, nitrogen or boron, and Me is at least one group IVb metal. The invention is also directed to a protection-coated tool made according to the method.

The group definition (group IVb) of the periodic system of elements corresponds to the "CRC Handbook of Chemistry and Physics", 46th edition, 1964.

It is known that the layer adhesion of MeX layers of the above defined type, such as for example of titanium nitride layers, is optimal if the substrate surface coated with it is very clean or an Me intermediate layer, in the stated example a titanium intermediate layer, is disposed between the tool substrate and the MeX coating. In this connection reference is made to Stolz et al., *Surface Engineering*, 1989, Vol. 5, No. 4, 305 or to Jehn et al., *Surface and Coatings Technology*, Vol. 41, No. 2, 1990, 167.

The reason for this is seen in the optimum anchoring which takes place due to the epitaxial growth of MeX, such as of titanium nitride, on the primary carbides of the tool substrate which is usually steel. In this connection reference is made to Helmersson et al., *J. Vac. Sci. Technol.* A3, 1985, 308. With respect to further tool coatings, reference is made to patent document GB-A-222633A, EP-A-0470359, GB-A-2110246, FR-A-2110202 and to "Chemical Abstracts", Vol. 93, No. 12, 22 Sept. 1980, Columbus, Ohio, U.S., Abstract No. 118218a: J. Tacijowski et al., "Properties of composite chromium and titanium carbide layers", page 211, column 2; Zusammenfassimg Metalozn Obrobka Cieplna, Vol. 42, 1979, Pol. p. 22–7.

The present invention builds on the finding that the measurement of the adhesion of wear-protection layers on tools, such as for example the one still to be described in conjunction with examples of the invention, does not permit any reliable statements about the service life to be expected from the tools. Good layer adhesion for the tool coatings, however, is indispensable.

SUMMARY OF THE INVENTION

The task of the present invention, namely to increase the service life of tools of the stated type, is solved by the method of the invention and by a tool of the invention.

In the following, and in conjunction with the examples, the approach according to the invention will be illustrated, which significantly increases the service life of tools. This increase has been achieved despite the fact that adhesion testing using known adhesion test methods, did not predict any improvements or impairments to service life.

While providing chromium intermediate layers is known in coating technology, their use, however, is limited to layer/substrate combinations with low metallurgic affinity, such as on metal/ceramic systems, in which connection reference is made to O. S. Heavens, *Le Journal de Physique et le Radium*, 11, 1950, 355 or D. M. Mattox, *Thin Solids Films*, 18 (1973), 173; or for example to tungsten metal systems, regarding which reference is made to Bergmann, Farges, Bosch, 14th International Conference, San Diego, 1987, *Wear* (1989).

The unexpected solution of the invention, namely to increase the service life of tools of the stated type, could not be verified with the usual adhesive test methods, probable because with MeX layers having very good adhesive per se, it is no longer the good adhesion that is decisive for the service life of the boundary between tool and layer but rather the optimum suppression of epitaxy which leads to a decrease of the toughness of the material bond. This suppression is probably especially well accomplished precisely through intermediate layer materials which have no pronounced metallurgic affinity to the MeX layer material and do no result in an increase of adhesion.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

In the following, the invention will be explained in conjunction with the examples.

Example 1

Four-edged end-mill cutters with a diameter of 16 mm by the company Fraisa, Type 01110, were coated with a reactive vapor deposition process, such as for example described in German Patent DE P 28 23 876 corresponding to the U.S. Pat. No. 4,197,175 or in EP-A-0 490 068 corresponding to U.S. Pat. No. 5,229,570, which U.S. patents, with respect to the present specification, are incorporated here by reference. Coating was effected through low-volt arc discharge vaporization with titanium nitride, for example. Initially the tools were heated for a period of 80 minutes with a dense plasma, such as described in EP-A-0 484 704 corresponding to U.S. Pat. No. 5,250,779, which is also incorporated here by reference. Subsequently, in particular the surfaces to be coated later, were etched for a period of 20 minutes with the stated plasma beam. Thereupon with the low-volt arc discharge, titanium was vaporized in a nitrogen atmosphere and on the tools was deposited the conventional golden yellow titanium nitride layer. In a known manner through process control, a metal Me titanium sublayer was deposited having a thickness $d < 1$ nm, which consequently is so thin that it does not interrupt the epitaxy effect between the microcystals of the substrate and the titanium nitride layer growing above it. The TiN layer has a thickness of approximately 4 μm.

Subsequently, identical tool substrates were coated identically but on the titanium to be vaporized was applied a chromium pellet with a weight of 3 g. The nitrogen feed had already been started shortly before the titanium was vaporized. An approximately 50 nm thick Cr or CrN layer resulted over which the approximately 4 μm thick titanium nitride layer was deposited. The end-mill cutters, with and without chromium intermediate layer, were used to carry out cutting tests in order to determine the service life and, on the other hand, adhesion tests were also carried out. The following cutting conditions were set:

Cutting conditions for service life comparison

Figure 4:
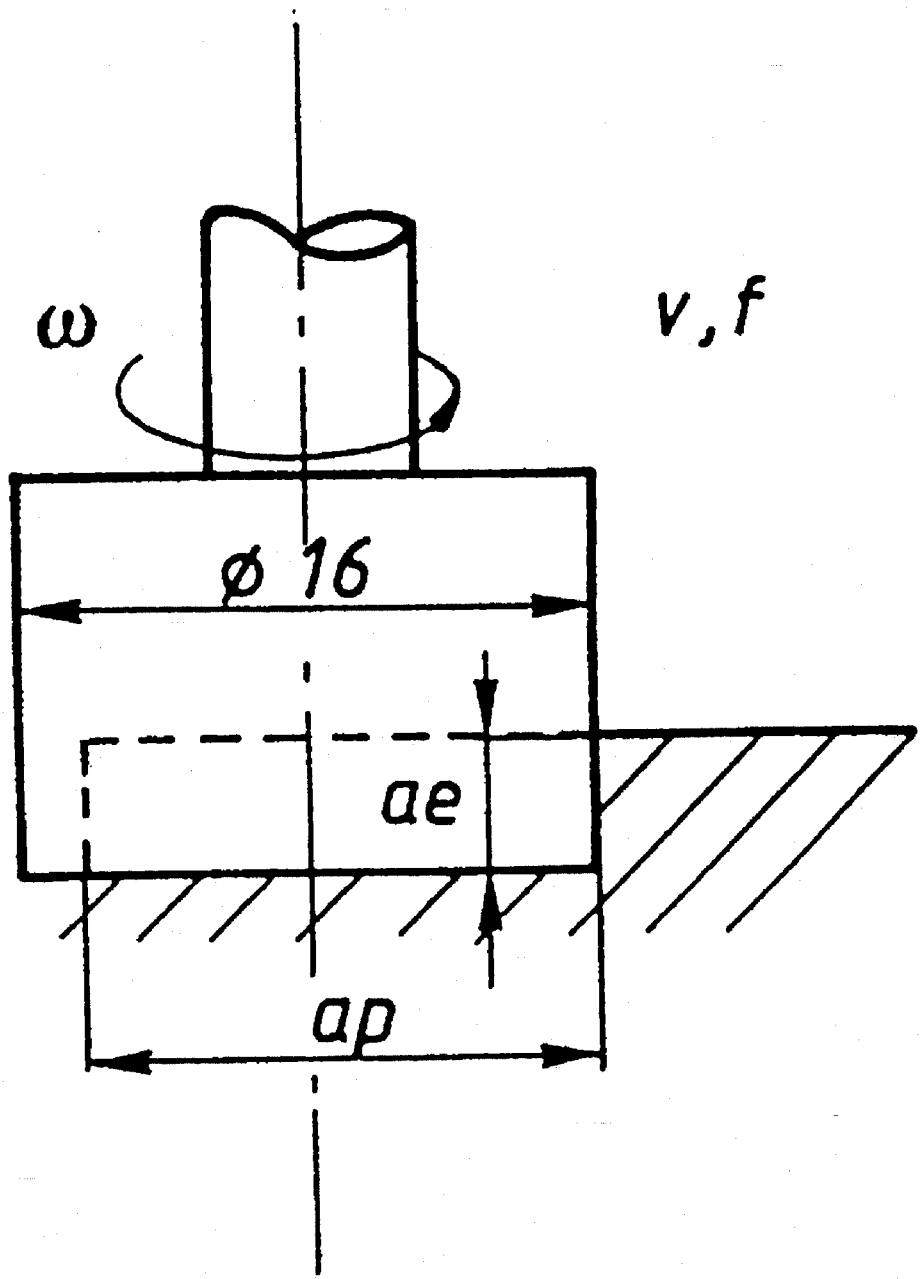
FIG. 4 is a schematic illustration of a milling tool used to verify the utility of the present invention.

| Milling machine: | |
| --- | --- |
| Universal milling machine: | Maho 800 P |
| Spindle power: | 5.5 kW |
| Range of speed: | 40–2000 rpm (geometrically stepped: 1.25) 10–750 mm/min (stepless) |
| Feeds: | |
| Cooling: | |
| Saturated jet cooling: | through 1 pipe |
| Cooling lubricant: | Blasocut 2000 Universal |
| Concentration: | 5% |
| Material of the work piece: | |
| Quenched and tempered steel: | 42CrMo4 |
| Strength: | 1100 N/mm$^2$ |
| Cutting data: | |
| Cutting speed: | V = 40 m/min |
| Feed: | f = 0.35 mm/turn |
| Radial advance according to FIG. 4 ae: | 2.5 mm |
| Axial advance according to FIG. 4 ap: | 15 mm |
| Machine direction according to FIG. 4: | cut-down milling |

Adhesion testing was carried out using the scratch test with Rockwell diamonds under loads of 3, 5, 8 and 10 kg. Furthermore, the Rockwell indentation test was also carried our under a load of 150 kg. In the Rockwell indentation test as well in the scratch test, no differences were determined for the differently coated end-mill cutters. In the scratch test loads of 10 kg were exceeded in both types of coating of the end-mill cutters. As the failure criterion, the occurrence of half moon-form breakouts at the margin of the scratch groove generated by the plastic scratch deformation, was selected.

It was found that with respect to the currently known stated adhesion testing method, no difference was found between the titanium nitride-coated end-mill cutters and the titanium nitride-coated end-mill cutters with chromium intermediate layer.

Figure 1:
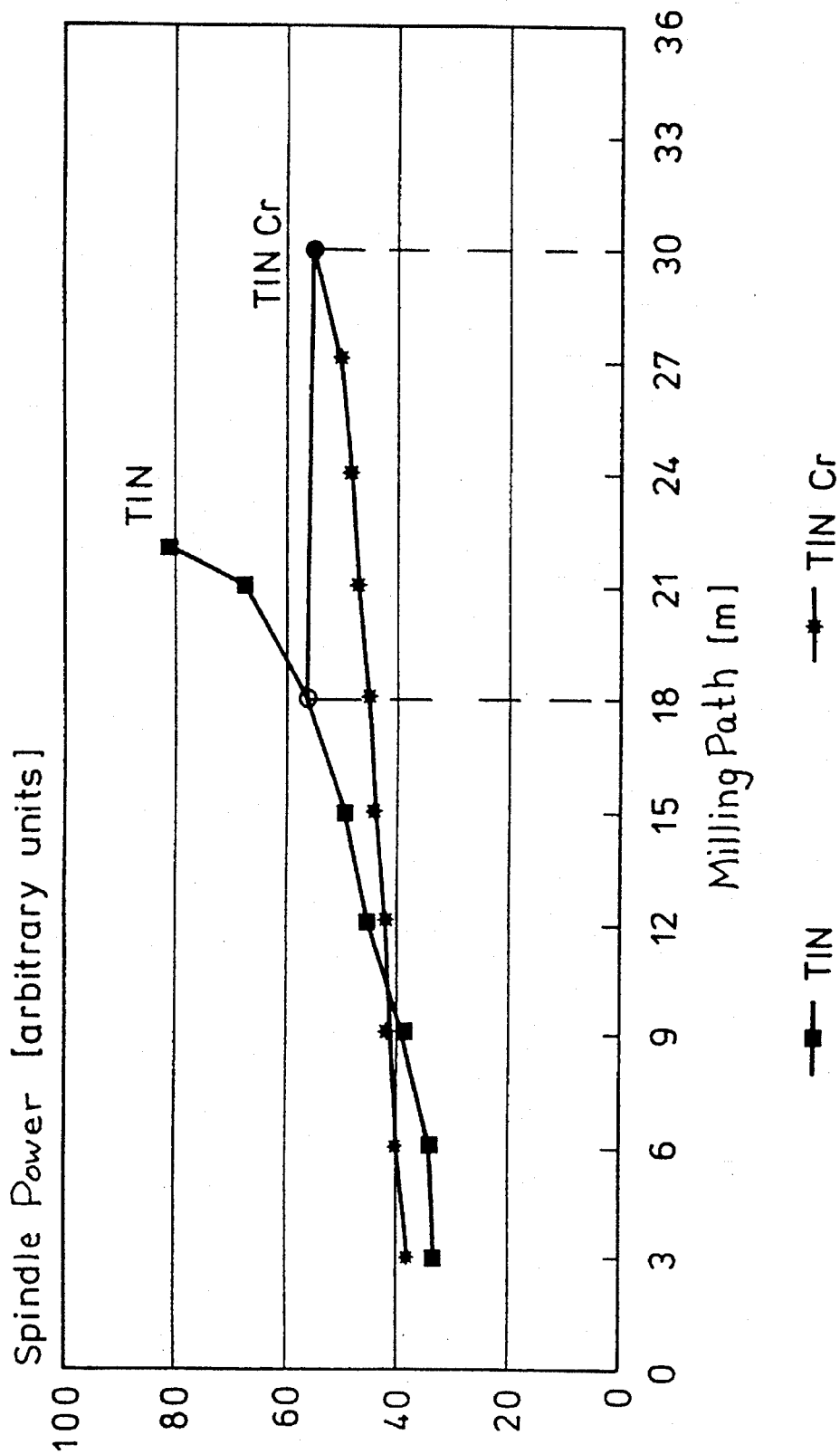
FIG. 1 is a graph illustrating milling behavior, specifically plotting milling path in meters against spindle power in arbitrary units.

FIG. 1 depicts the milling behavior of the cutters with and without chromium intermediate layer. Spindle power is plotted on the Y-axis, in a relative scale, and the milling path is plotted on the X-axis. It can readily be seen that the end-mill cutters with chromium intermediate layer create significantly longer milling paths, at lower spindle power, than the conventional titanium nitride-coated end-mill cutters. The cutters of the present invention consequently, have a significantly longer service life. A service life comparison results, for example, by comparing the milling paths at identical applied spindle powers, at the relative power shown in FIG. 1 of approximately 55. From this an increase of the service life of practically 40% due to the chromium intermediate layer, can be seen.

Example 2

The vapor deposition installation defined above for Example 1 was charges with the same end-mill cutters as in Example 1. Instead of the 3 g chromium pellet used there, however, an 8 g chromium pellet was used on the titanium to be vaporized. A Cr/CrN layer of approximately 400 nm thick was deposited on the end-mill cutters, between the end-mill cutter substrate and the succeeding titanium nitride layer which had a thickness of 4 μm.

Figure 2:
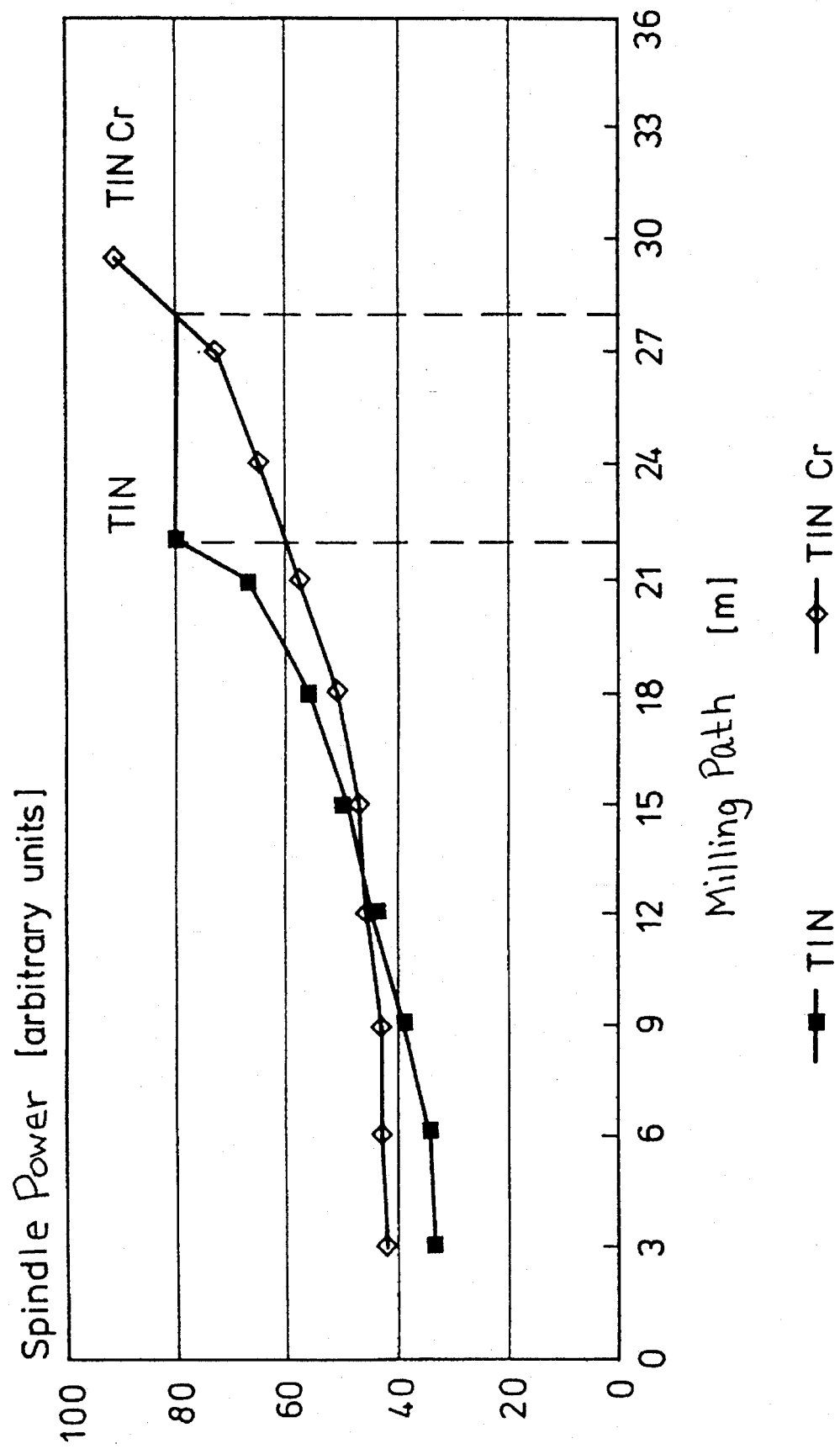
FIG. 2 is a graph similar to FIG. 1, illustrating the results of another experiment.

In order to determine their service life, the end-mill cutters coated in this way were again compared in FIG. 2 with the titanium nitride-coated cutters from Example 1 without a chromium intermediate layer. It was again found that the end-mill cutters with the chromium intermediate layer had an increased service life. The cutting path per spindle power increased in that, for example, with the relative spindle power 80 the milling path for end-mill cutters with chromium intermediate layer increased by approximately 20%, but compared to Example 1 the achieved service life in "milling path units" and per spindle power was worse.

Consequently, the service life of the end-mill cutters is impaired if the chromium intermediate layer provided according to the invention becomes too thick.

Again, the adhesion test methods according to Example 1 were carried out. It was found that in the scratch test with, Rockwell diamond loads of 10 kg could again be exceeded. Examination and evaluation of the scratch tracks on the end-mill cutters with chromium intermediate layer according to Example 1 and according to Example 2 had on the cutters of Example 2, markedly less damage on the layer substrate bond. This was in comparison with the comparison end-mill cutters provided with a metal titanium sublayer according to Example 1 or Example 2. This shows that the conventional teaching of the improvement of adhesion through chromium layers rests on an erroneous interpretation that adhesion tests. Chromium sublayers of average thickness do improve the result of the adhesion tests because these average-thickness chromium layers according to this Example 2, make the material bond substrate/intermediate layer/wear-protection layer more ductile, but this is a criterion which is not meaningful for judging the tool service life.

In Example 1, as well as in Example 2, it is apparent in the associated FIGS. 1 and 2 that the initial ability of the TiN-coated end-mill cutters is higher than that of the end-mill cutters provided according to the invention with chromium intermediate layer. This slight disadvantage which can readily be accepted, rests on the fact that due to providing the chromium intermediate layer there is generated a somewhat increased rounding of the cutting edge.

Example 3

Twist drills were coated with TiN in the vapor deposition installation according to Example 1. Here too the metal layer was thinner than 1 nm so that it did not interrupt the epitaxy effect between the microcrystals of the twist drill substrate and the titanium nitride layer growing above it. The thickness of the nitride layer was approximately 3.1 μm. As the drills, the following were used:

| | |
|---|---|
| Material: | HSS (S 6-5-2), according to DIN 1.3343 |
| Diameter φ: | 6 mm |
| Lengths: | 93 × 57 mm (total × cutting part) |
| obtaining from | Göhring, Germany |
| After they were coated with TiN, they were subjected to the following test: | |
| Drilling material: | AISI D 3, according to DIN 1.2080 |
| Composition in percent: | C 1.65/Si 0.3/Mn 0.3/Cr 11.5/V 0.1 |
| obtained from | Precision Steel, Sweden |
| speed: | 1850 rpm (according to $n = \frac{1000 \, V}{\pi \phi}$) |
| Feed S: | 0.12 mm per turn (according to $S = \frac{60 \, L}{t \, n}$) |
| cutting speed v: | 34.87 m/mim (according to $v = \frac{n \phi \pi}{1000}$) |
| Bore type: with: | 15 mm pocket bores (L) |
| L: | path of spindle (mm) |
| t: | time (sec) |

Pocket holes were drilled into the test plate at distances of 7.5 mm. Blasocut Universal 2000 was used as the cooling lubricant.

After an average of 79 bores the TiN-coated drills showed such strong signs of wear that the test had to be terminated.

Subsequently, with the same installation the identical twist drills were coated identically wherein, however, before the titanium nitride layer formation, 4 g of chromium were vaporized. Between the approximately 3.1 µm thick titanium nitride layer and the drill substrate, an approximately 50 nm thick chromium layer results followed by a chromium nitride/chromium layer of similar thickness, consequently a CrX layer according to the invention of approximately 100 nm thickness caused by introducing nitrogen before the start of the titanium vaporization. The drills coated in this way were subjected to the same test conditions. On the average, 100 bores resulted per tested twist drill coated according to the invention.

It is evident on this basis that by providing the approximately 100 nm chromium/chromium nitride layer a significant increase in the service life of the twist drills, by approximately 20%, was achieved.

Example 4

In an installation like the one depicted and described in U.S. Pat. No. 4,877,505 (corresponding to EP-A- 0 306 612), incorporated, in this respect, by reference here, and also according to the method described there, the same twist drills were coated as in Example 3 with titanium aluminum nitride. Titanium was magnetron-sputtered and simultaneously aluminum was arc-vaporized. Both processes were carried out in a nitrogen atmosphere. In this way a 4 µm thick TiAlN layer was built. The drills coated in this way were subjected to the drill tests described in Example 3. Subsequently, the identical twist drills were coated identically, except that on the aluminum crucible, a 4 g chromium pellet was placed and chromium was vaporized before the start of the titanium sputtering and the aluminum vaporization. In this way, between the twist drill substrate and the titanium aluminum nitride layer, an approximately 50 nm thick Cr/CrN layer was deposited. the drills coated in this way according to the invention were also subjected to the drill tests stated already.

Figure 3:
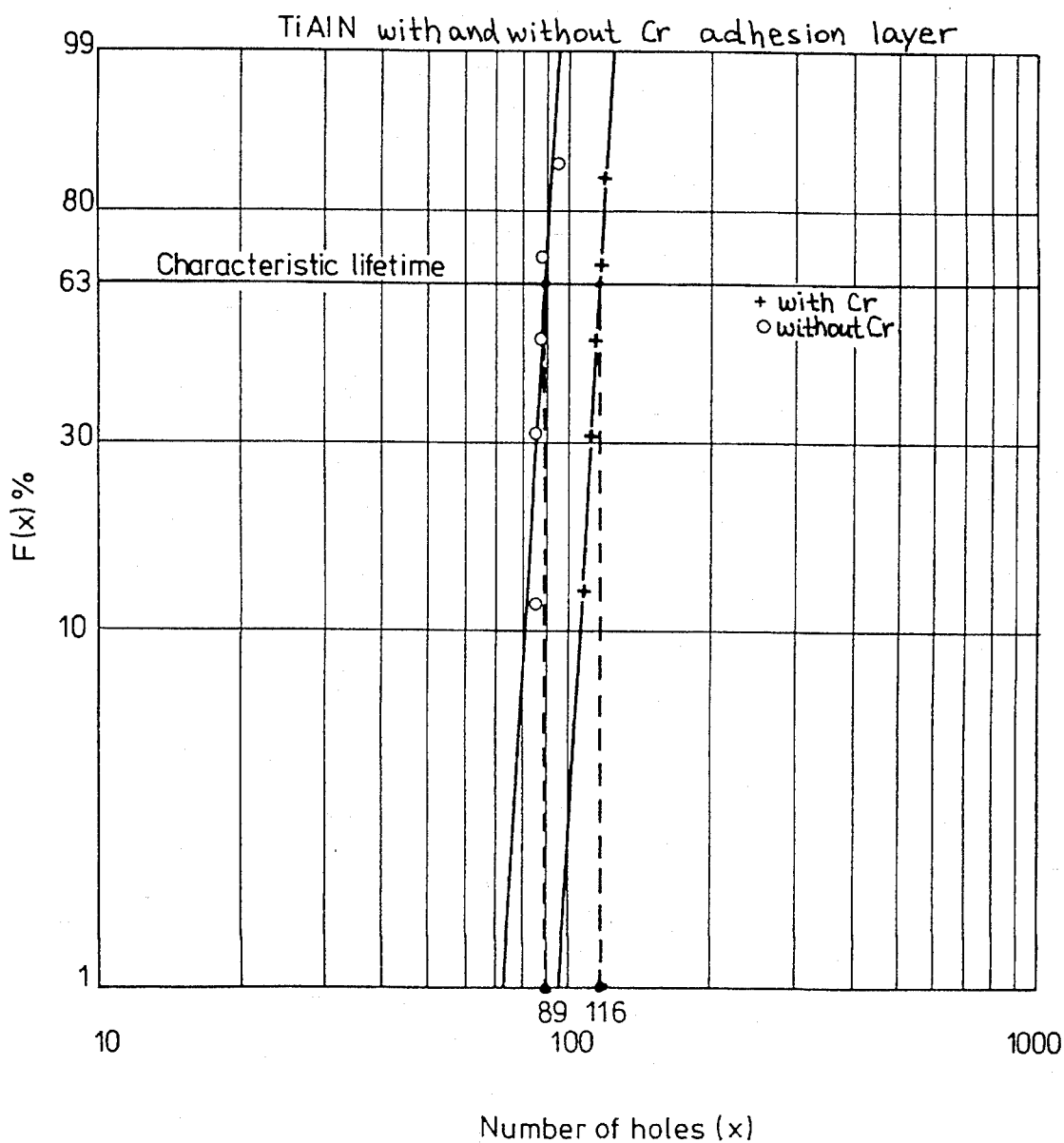
FIG. 3 is a graph illustrating a so-called Weibull distribution, plotting a number of holes drilled against force applied.

FIG. 3 depicts the resulting Weibull distribution for the stated drills, with and without the chromium intermediate layer. It is known that for the Weibull distribution F(x) applies where:

$$F(x) = 1 - \exp(-(x/T)^\beta)$$

with

T: characteristic lifetime in number of holes
β: form factor
x: hole number
Example: at $\beta = 8$
T=360 holes
x=250

$$F(x) = 0.052 \div 5.2\%,$$

thus, at this distribution 5.2% of the drill hole numbers are smaller than 250.

In FIG. 3:

$\beta = 24.1$ x=value of T: 89.2 or 116.1

Based on this, the improvement of the drill service life by providing the chromium intermediate layer according to the invention is readily apparent.

Although this example involves a different layer material, with the chromium intermediate layer a marked performance increase was achieved. Similarly good results are also achieved with other coating methods, such as reactive thermal vaporization, as well as also reactive arc vaporization, generally through reactive PVD or plasma-enhanced CVD methods.

Although providing the chromium or CrX intermediate layer according to the invention was described in connection with titanium nitrides and titanium aluminum nitride layers, similarly good results were also achieved with titanium carbonitride layers and it is expected with high probability that providing according to the invention a chromium intermediate layer with all layers specified in the claims, yields an improvement of the service life, in particular where the outer layer is MeX and Me is at least 50% a group IVb metal and X is C, O, N and or B with less than 50% oxygen.

Example 5

Comparison of drills of a type specified in Example 3 and coated in a manner identical to that used in Example 3 with thin Cr layers, thick Cr layers and without Cr layer and tested according to Example 3 yielded the following results:

| | Charge 1 | Charge 2 | Charge 3 |
|---|---|---|---|
| Arc current for Cr vaporization | 80A | 140A | — |
| Time Cr vaporization | 4 min | 4 min | — |
| Quantity of Cr vaporized | 5 g | 8 g | — |
| Layer thickness Cr + CrN | 0.2 µm | 0.3 µm | — |
| Layer thickness Cr | <0.1 µm | >0.1 µm | — |
| Drilling results | 70–80 holes | 50–60 holes | 20–30 holes |
| Max. coating temperature | 250° C. | 250° C. | 250° C. |

Therefrom it becomes clear that already a thickness value beyond a limit thickness value of 0.1 µm leads to a significant improvement of the service life of the drills.

The following is a table showing equivalents among the four U.S. patents which are incorporated by reference in the present application, and corresponding foreign patents or patent applications.

TABLE

| | | | |
|---|---|---|---|
| DE 28 23 876 | = | US 4,197,175 | |
| EP 0 306 612 | = | US 4,877,505 | = JP 63-203972 |
| EP 0 484 704 | = | US 5,250,779 | = JP 3-288006 |
| EP 0 490 068 | = | US 5,299,570 | = JP 3-330548 |

While a specific embodiment of the invention has been shown and described in detail to illustrate the application of the principles of the invention, it will be understood that the invention may be embodied otherwise without departing from such principles.

What is claimed is:

1. A machining or forming tool with a substrate and coated with a wear-protection coating layer of MeX, wherein
   Me is a metal or alloy comprising at least 50% of at least one metal of group IVb;
   X is at least one of C, O, N and B, with less than 50% oxygen;
   the tool including, between the tool substrate and the wear-protection layer, an intermediate layer of substantially only CrX plus Cr, having a thickness d of
   $5 \text{ nm} \leq d \leq 1000 \text{ nm}$.

2. A tool as stated in claim 1, wherein the intermediate layer has a thickness d of
   $5 \text{ nm} \leq d \leq 400 \text{ nm}$.

3. A tool as stated in claim 2, wherein the intermediate layer has a thickness d of
   $10 \text{ nm} \leq d \leq 100 \text{ nm}$.

4. A tool as stated in claim 2, wherein the intermediate layer has a thickness d of
   $d \approx 50 \text{ nm}$.

5. A tool as stated in claim 1, wherein the wear protection layer is at least one of a TiN, TiCN or TiAlN.

6. A tool as stated in claim 1, wherein the tool substrate comprises steel.

7. A tool as stated in claim 1 comprising one of a drill or an end-mill cutter.

* * * * *